United States Patent
Song et al.

(10) Patent No.: US 11,722,129 B2
(45) Date of Patent: Aug. 8, 2023

(54) UNIVERSAL CLAMPING CIRCUIT FOR AUTOMOTIVE SWITCH GATE DRIVES

(71) Applicant: Ford Global Technologies, LLC, Dearborn, MI (US)

(72) Inventors: Yantao Song, Northville, MI (US); Baoming Ge, Okemos, MI (US); Lihua Chen, Farmington Hills, MI (US); Serdar Hakki Yonak, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 17/711,480

(22) Filed: Apr. 1, 2022

(65) Prior Publication Data

US 2022/0337234 A1  Oct. 20, 2022

Related U.S. Application Data

(62) Division of application No. 16/752,241, filed on Jan. 24, 2020, now Pat. No. 11,309,881.

(51) Int. Cl.
*H03K 17/082*    (2006.01)
*H02M 1/34*      (2007.01)
*H03K 17/567*    (2006.01)
*H02M 1/00*      (2006.01)

(52) U.S. Cl.
CPC ......... *H03K 17/0822* (2013.01); *H02M 1/34* (2013.01); *H03K 17/567* (2013.01); *H02M 1/0048* (2021.05); *H02M 1/344* (2021.05)

(58) Field of Classification Search
CPC ... H03K 17/0822; H03K 17/567; H02M 1/34; H02M 1/0048; H02M 1/344
See application file for complete search history.

(56) References Cited

U.S. PATENT DOCUMENTS

| 2006/0043490 A1* | 3/2006 | Brauchler ........... H01L 27/0266 257/355 |
| 2013/0033909 A1* | 2/2013 | Jones ................. H03K 17/0812 361/91.5 |
| 2016/0236579 A1* | 8/2016 | Yim ........................ B60L 53/24 |
| 2019/0052167 A1  | 2/2019 | Escudero Rodriguez et al. |

OTHER PUBLICATIONS

"Half-Bridge Driver With Overcurrent Protection", Infineon, www.infineon.com, Mar. 2, 2017, pp. 1-26.
"Power MOSFET Selecting MOSFFETS and Consideration for Circuit Design", Toshiba Electronic Devices & Storage Corporation, Jul. 26, 2018, pp. 1-18.

* cited by examiner

*Primary Examiner* — Lincoln D Donovan
*Assistant Examiner* — Alex W Lam
(74) *Attorney, Agent, or Firm* — David B. Kelley; Brooks Kushman P.C.

(57) ABSTRACT

An automotive vehicle includes an electric machine, a traction battery, and a power converter. The power converter transfers power between the electric machine and traction battery. The power convert includes a switch that defines a portion of a phase leg, a gate driver circuit that provides provide power to a gate of the switch, and a clamping circuit. The clamping circuit includes a clamping switch that, responsive to the gate driver circuit being de-energized and a voltage of the gate exceeding a predetermined threshold value, conducts current from the gate to dissipate the voltage and clamp the gate to an emitter of the switch.

10 Claims, 3 Drawing Sheets

UNIVERSAL CLAMPING CIRCUIT FOR AUTOMOTIVE SWITCH GATE DRIVES

CROSS-REFERENCE TO RELATED APPLICATIONS

This application is a division of U.S. application Ser. No. 16/752,241, filed Jan. 24, 2020, the disclosure of which is hereby incorporated in its entirety by reference herein.

TECHNICAL FIELD

This disclosure relates to automotive power electronics components.

BACKGROUND

An electric or hybrid vehicle may contain one or more motors for propulsion. The vehicle may also contain a traction battery as a source of energy for the motor, and a generator to charge the traction battery. As the motor, traction battery, and generator may require varying electrical parameters, electrical communication between them may require modification of the power provided or consumed.

SUMMARY

An automotive vehicle includes an electric machine, a traction battery, and a power converter. The power converter transfers power between the electric machine and traction battery, and includes a switch defining a portion of a phase leg, a gate driver circuit that provides power to a gate of the switch, and a clamping circuit that includes a clamping switch. The clamping switch, responsive to the gate driver circuit being de-energized and a voltage of the gate exceeding a predetermined threshold value, conducts current from the gate to dissipate the voltage and clamp the gate to an emitter of the switch.

A power converter includes an insulated gate bipolar transistor (IGBT), a gate driver circuit that provides power to a gate of the IGBT, and a bipolar junction transistor (BJT). The BJT, responsive to the gate driver circuit being de-energized and a voltage of a gate of the IGBT exceeding a predetermined threshold value, conducts current from the gate to dissipate the voltage and clamps the gate to an emitter of the IGBT.

An automotive vehicle includes an electric machine, a traction battery, and a power converter. The power converter transfers power between the electric machine and traction battery, and includes a switch that defines a portion of a phase leg, a gate driver circuit that provides power to a gate of the switch, and a clamping circuit that includes first and second clamping switches. The first clamping switch, responsive to the gate driver circuit being de-energized and a voltage of the gate of the switch exceeding a predetermined threshold value, conducts current from the gate of the switch to a gate of the second clamping switch to increase a voltage of the gate of the second clamping switch. The second clamping switch, responsive to the voltage of the gate of the second clamping switch exceeding another predetermined threshold value, conducts current such that the gate and emitter of the switch are clamped together

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Figure 1:
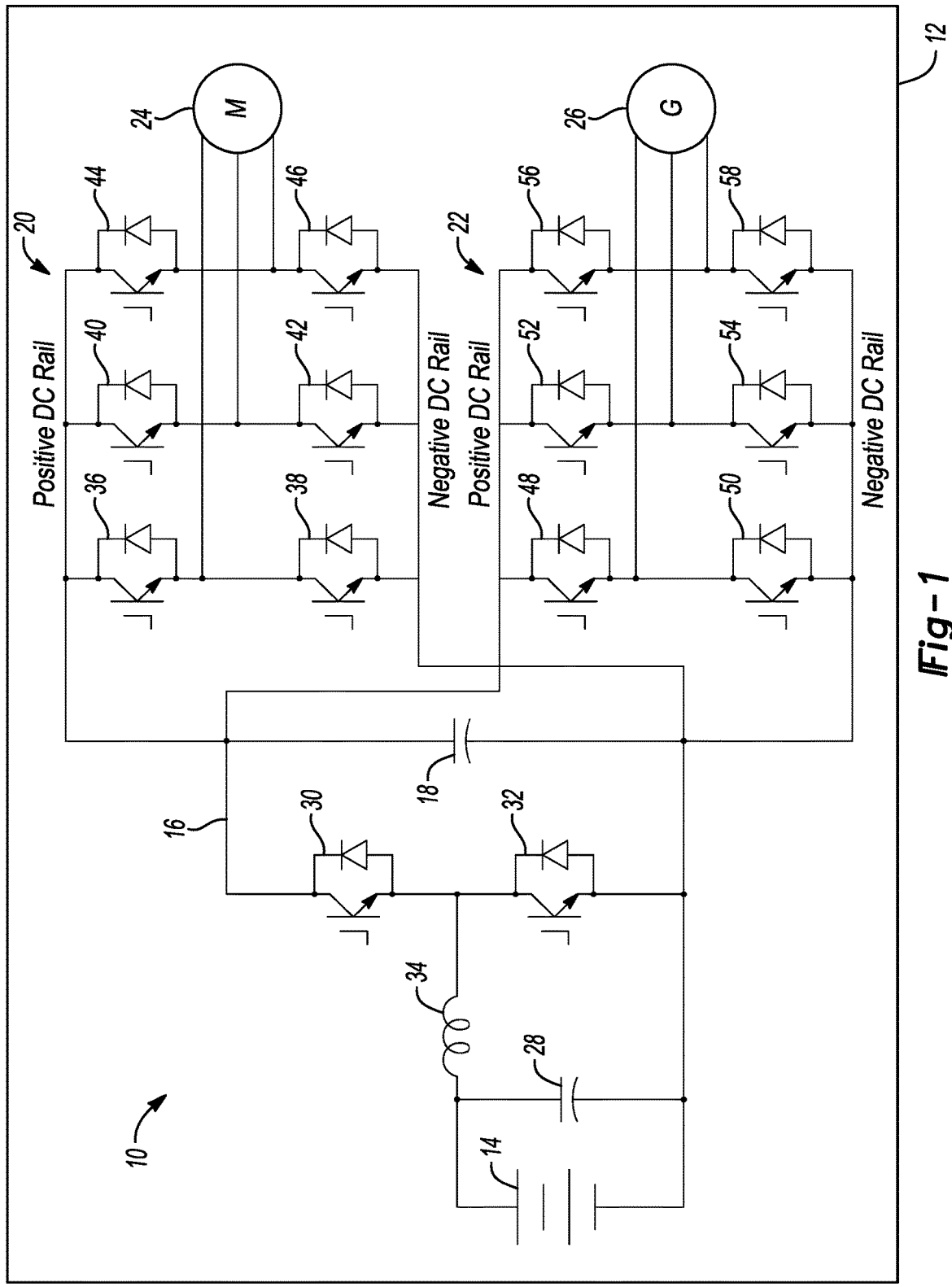
FIG. 1 is a schematic diagram of an electric drive system of a vehicle.

Power electronics converters/inverters have been extensively used in hybrid electric vehicle and electric vehicle drive systems. As shown in FIG. 1, an electric drive system 10 for a vehicle 12 includes a traction battery 14, a bridge-based DC-DC converter 16, a DC-link capacitor 18 for DC bus 19, two power converters (DC-AC inverters) 20, 22, a motor 24, and a generator 26. The bridge-based DC-DC converter 16 includes a capacitor 28 in parallel with the traction battery 14, a pair of series connected switches 30, 32 (e.g., transistors), and an inductor 34 between the capacitor and series connected switches 30, 32.

The DC-AC inverter 20 includes, in this example, three pairs of series connected switches 36, 38, 40, 42, 44, 46. Each of the pairs defines a corresponding phase leg for the motor 24. The DC-AC inverter 26 also includes three pairs of series connected switches 48, 50, 52, 54, 56, 58. Each of the pairs defines a corresponding phase leg for the motor generator 26. The switches 36, 38, 40, 42, 44, 46, 48, 50, 52, 54, 56, 58 can be insulated gate bipolar transistors (IGBTs), metal oxide semiconductor field effect transistors (MOSFETs), or other controllable semiconductor devices. In the following examples, the switches 36, 38, 40, 42, 44, 46, 48, 50, 52, 54, 56, 58 are shown to be IGBTs.

A voltage associated with power from the traction battery 14 may be increased by operation of the bridge-based DC-DC converter 16 for eventual delivery to the DC-AC inverter 20 and thus the motor 24 to propel the vehicle 12. Likewise, regenerative power captured by the generator 26 may be passed through the DC-AC inverter 22 and so on for storage in the traction battery 14.

Dual-on conditions can occur across the phase legs of the DC-AC inverters 20, 22. Gate signals of the switches 36, 38, for example, are usually complementary. In normal operating conditions, only one of the switches 36, 38 is turned on at any time. In the dual-on condition, the switches 36, 38 are on at the same time, and the high DC voltage source is directly short circuited by the low impedance formed by the on-state resistances of the switches 36, 38. The dual-on condition can generate a large current that is much higher than the normal operating current of the switches 36, 38.

Figure 2:
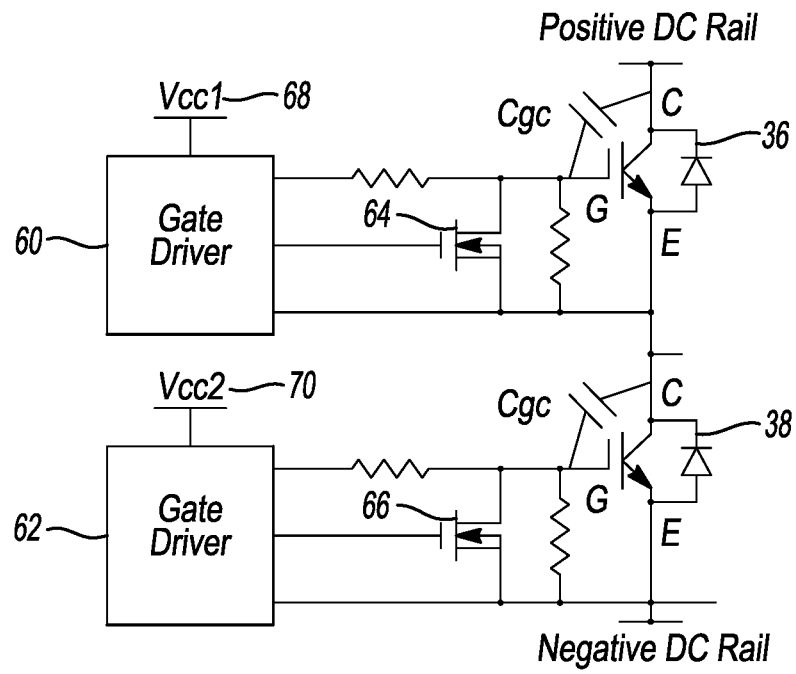
FIG. 2 is a schematic diagram of a phase leg of FIG. 1 and corresponding control circuitry.

FIG. 2 shows one of the phase legs of the DC-AC inverter 20 and its gate driver circuits 60, 62. The switches 36, 38 are the main power switches as implied above, and switches 64, 66 are, in this example, miller-clamp switches. When the gate driver circuits 60, 62 are energized by power supplies 68, 70 respectively, the output status of the gate driver circuits 60, 62 is either high or low. When the switches 36, 38 are off, the clamping switches 64, 66 are turned on, and the gate G to emitter E of each of the switches 36, 38 is shorted by the low impedance of the switches 64, 66 respectively. Therefore, the switches 36, 38 are in the off state. Several resistors are also shown in FIG. 2 and other figures. These are arranged in usual fashion and therefore need not be discussed in further detail.

When the power supplies 68, 70 have no power however, the gate driver circuits 60, 62 and miller-clamping switches 64, 66 lose function. The outputs of the gate driver circuits 60, 62 are in a high-impedance state, and the miller-clamping switches 64, 66 are also in a high-impedance state. Therefore, the gate-to-emitter impedance of each of the switches 36, 38 is very high. If high voltage is applied to the DC bus 19 in this situation and the DC bus voltage fluctuates, current flowing through the parasitic capacitor Cgc of each of the switches 36, 38 will charge the gate capacitor of each of the switches 36, 38. If the DC bus voltage changes fast enough, the generated gate voltage by the charge current flowing through Cgc will cause the switches 36, 38 to turn on. If both of the switches 36, 38 are turned on, then a dual-on condition will occur as explained above.

Here, clamping circuits are proposed that prevent unintentional switch activation conditions of converters/inverters regardless of whether gate driver power supplies are energized.

Figure 3:
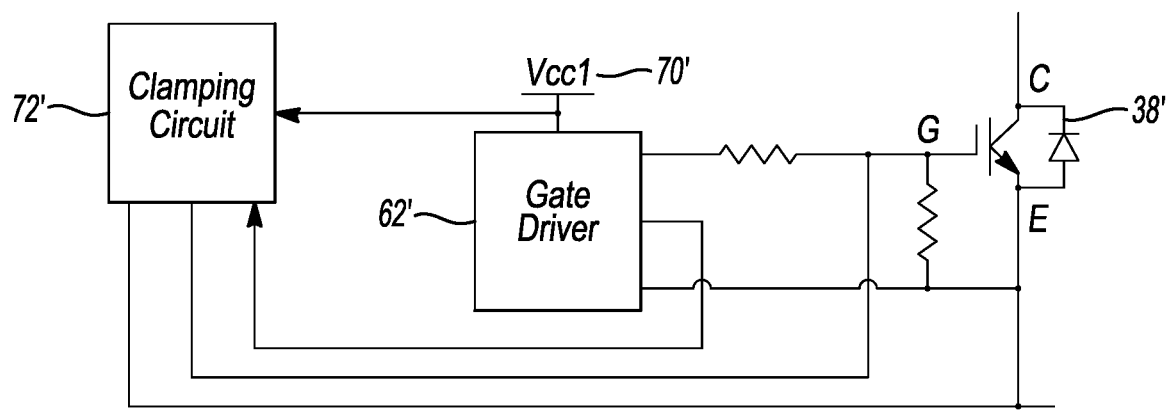
FIG. 3 is a schematic diagram of proposed clamping circuitry.

As shown in FIG. 3, clamping circuit 72' monitors the power supply 70'. If the power supply 70' is not energized, the clamping circuit 72' shorts the gate G to the emitter E of the switch 38' by a low impedance to prevent the switch 38' from turning on. If the power supply 70' is energized, the clamping circuit 72' cooperates with the gate driver circuit 62' to prevent the switch 38' from inadvertently turning on. Such circuitry, for example, could be associated with each of the switches 38, 42, 46 (FIG. 1) and the switches 50, 54, 58 (FIG. 1).

Figure 4:
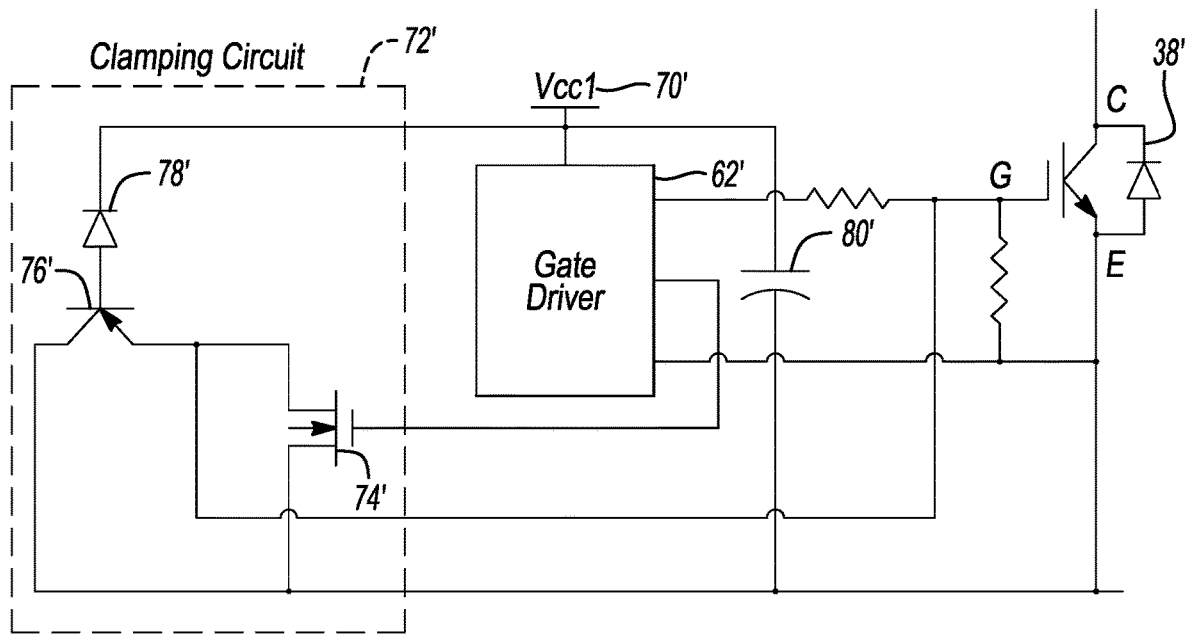
FIG. 4 is a schematic diagram of an implementation of the proposed clamping circuitry of FIG. 3.

One implementation of the proposed clamping circuit 72' is shown in FIG. 4. The clamping circuit 72' includes switches 74', 76', diode 78', and capacitor 80'. In this example, the switch 74' is a metal oxide semiconductor field effect transistor (MOSFET) and the switch 76' (clamping switch) is a bipolar junction transistor (BJT). They can be discrete devices or integrated into the gate driver integrated circuitry. Other types of switches/transistors may also be used. The gate of the MOSFET 74' is directly electrically connected with an output of the gate driver 62'. And the drain and source of the MOSFET 74' are electrically connected between the emitter of the BJT 76' and the emitter of the IGBT 38', with the drain being directly electrically connected with the emitter of the BJT 76' and the source being directly electrically connected with the emitter of the IGBT 38'. The base of the BJT 76' is directly electrically connected with the anode of the diode 78'. The emitter of the BJT 76' is directly electrically connected with the gate of the IGBT 38'. And the collector of the BJT 76' is directly electrically connected with the emitter of the IGBT 38'. One terminal of the of the capacitor 80' is directly electrically connected to the power supply 70' and the cathode of the diode 78'. The other terminal of the capacitor 80' is directly electrically connected to the emitter of the IGBT 38'.

Responsive to the power supply 70' not being applied, the switch 76' performs the clamping function. Once the gate voltage of the switch 38' exceeds the threshold voltage of the switch 76' (e.g., 1.4V), the switch 76' will complete the circuit between the gate and emitter of the switch 38', conduct to discharge the parasitic capacitance Cge of the switch 38', and clamp the gate voltage of the switch 38' to be under 1.4V, which is lower than the turn-on threshold voltage of the switch 38'. Therefore, the switch 38' can be in the off state. Responsive to the power supply 70' being applied, the switch 76' will be in the off state, and the switch 74' will perform the clamping function as described with reference to the switch 66 of FIG. 2.

Figure 5:
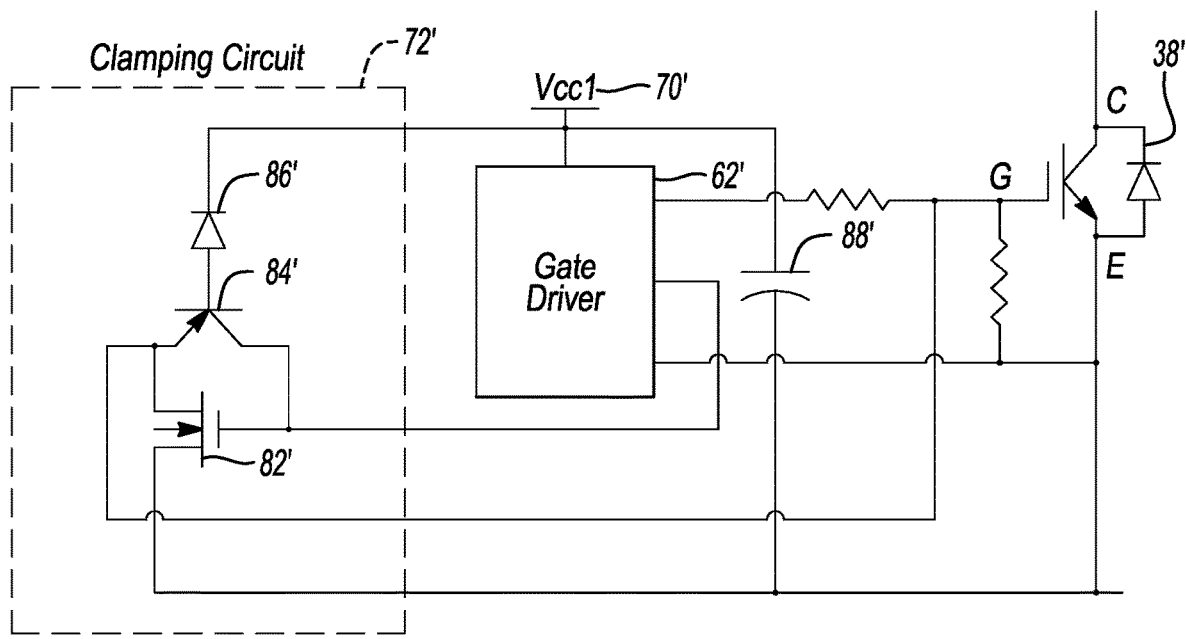
FIG. 5 is a schematic diagram of another implementation of the proposed clamping circuitry of FIG. 3.

Another implementation of the proposed clamping circuit 72' is shown in FIG. 5. The clamping circuit 72' includes switches 82', 84', diode 86', and capacitor 88'. In this example, the switch 82' is a MOSFET and the switch 84' (clamping switch) is a BJT. Other arrangements, however, are also possible. The gate of the MOSFET 82' is directly electrically connected with the collector of the BJT 84' and an output of the gate driver 62'. And the drain and source of the MOSFET 82' are electrically connected between the emitter of the BJT 84' and the emitter of the IGBT 38', with the drain being directly electrically connected with the emitter of the BJT 76' and the source being directly electrically connected with the emitter of the IGBT 38'. The base of the BJT 84' is directly electrically connected with the anode of the diode 86'. One terminal of the of the capacitor 88' is directly electrically connected to the power supply 70' and the cathode of the diode 86'. The other terminal of the capacitor 88' is directly electrically connected to the emitter of the IGBT 38'.

Responsive to the power supply 70' not being applied, the switches 82', 84' perform the clamping function. Once the gate voltage of the switch 38' exceeds the threshold voltage of the switch 84' (e.g., 1.4V), the switch 84' will conduct to charge the gate of the switch 82'. As the gate voltage of the switch 82' exceeds the turn-on threshold of the switch 82', it will conduct and discharge the parasitic capacitance Cge of the switch 38' together with the switch 84'. The gate voltage of the switch 38' will be clamped to 1.4V. Responsive to the power supply 70' being applied, the switch 84' will be in the off state, and the switch 82' will perform the clamping function as described with reference to the switch 66 of FIG. 2.

The processes, methods, or algorithms disclosed herein may be deliverable to or implemented by a processing device, controller, or computer, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An automotive vehicle comprising:
    an electric machine;
    a traction battery; and
    a power converter configured to transfer power between the electric machine and traction battery, and including a switch defining a portion of a phase leg, a gate driver circuit configured to provide power to a gate of the switch, and a clamping circuit including a clamping switch, wherein the clamping switch is configured to, responsive to the gate driver circuit being de-energized and a voltage of the gate exceeding a predetermined threshold value, conduct current from the gate to dissipate the voltage and clamp the gate to an emitter of the switch, wherein the clamping switch is a bipolar junction transistor (BJT), and wherein an emitter of the BJT is directly electrically connected with the gate of the switch.

2. The vehicle of claim 1 further comprising a diode electrically connected between the clamping switch and the gate driver circuit, wherein a base of the BJT is directly electrically connected with an anode of the diode.

3. The vehicle of claim 1, wherein the clamping circuit further includes a metal oxide semiconductor field effect transistor having a gate directly electrically connected with the gate driver circuit.

4. The vehicle of claim 1, wherein the clamping circuit further includes a metal oxide semiconductor field effect transistor having a drain and source electrically connected between the clamping switch and the switch.

5. The vehicle of claim 1, wherein a collector of the BJT is directly electrically connected with the gate driver circuit.

6. The vehicle of claim 5, wherein the clamping circuit further includes a metal oxide semiconductor field effect transistor having a gate directly electrically connected with the collector of the BJT.

7. The vehicle of claim 1, wherein the switch is an insulated gate bipolar transistor.

8. A power converter comprising:
    an insulated gate bipolar transistor (IGBT);
    a gate driver circuit configured to provide power to a gate of the IGBT; and
    a bipolar junction transistor (BJT) configured to, responsive to the gate driver circuit being de-energized and a voltage of a gate of the IGBT exceeding a predetermined threshold value, conduct current from the gate to dissipate the voltage and clamp the gate to an emitter of the IGBT, wherein a collector of the BJT is directly electrically connected with the gate driver circuit.

9. The power converter of claim 8, wherein an emitter of the BJT is directly electrically connected with the gate of the IGBT.

10. The power converter of claim 8 further comprising a metal oxide semiconductor field effect transistor having a gate directly electrically connected with the collector of the BJT.

* * * * *